(12) United States Patent
Kim et al.

(10) Patent No.: US 11,955,281 B2
(45) Date of Patent: Apr. 9, 2024

(54) ELECTRONIC COMPONENT AND BOARD FOR MOUNTING THE SAME

(71) Applicant: SAMSUNG ELECTRO-MECHANICS CO., LTD., Suwon-si (KR)

(72) Inventors: Jae Hoon Kim, Suwon-si (KR); Chang Hee Lee, Suwon-si (KR); Jea Hoon Lee, Suwon-si (KR); Hye Jin Kim, Suwon-si (KR); Yeo Ju Cho, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/321,977

(22) Filed: May 17, 2021

(65) Prior Publication Data

US 2022/0165493 A1     May 26, 2022

(30) Foreign Application Priority Data

Nov. 24, 2020   (KR) ........................ 10-2020-0159048

(51) Int. Cl.
*H01G 2/06*      (2006.01)
*H01G 4/248*     (2006.01)
*H01G 4/30*      (2006.01)

(52) U.S. Cl.
CPC ............... *H01G 2/06* (2013.01); *H01G 4/248* (2013.01); *H01G 4/30* (2013.01)

(58) Field of Classification Search
None
See application file for complete search history.

(56) References Cited

U.S. PATENT DOCUMENTS

| | | | |
|---|---|---|---|
| 10,192,686 B1 * | 1/2019 | Park | H01G 2/065 |
| 10,553,362 B1 * | 2/2020 | Sim | H01G 4/232 |
| 2016/0007446 A1 * | 1/2016 | Ishikawa | H05K 1/181 |
| | | | 361/301.4 |
| 2016/0111215 A1 * | 4/2016 | Park | H01G 4/30 |
| | | | 361/301.4 |
| 2018/0158608 A1 * | 6/2018 | Fujita | H01G 4/224 |
| 2019/0157005 A1 * | 5/2019 | Son | H01G 4/35 |
| 2022/0165493 A1 * | 5/2022 | Kim | H01G 4/30 |

FOREIGN PATENT DOCUMENTS

| | | |
|---|---|---|
| JP | 2015-023209 A | 2/2015 |
| KR | 10-2019-0057541 A | 5/2019 |
| KR | 20170028610 A  * | 2/2020 |

* cited by examiner

*Primary Examiner* — Dion R. Ferguson
(74) *Attorney, Agent, or Firm* — MORGAN, LEWIS & BOCKIUS LLP (57) ABSTRACT

An electronic component includes: a multilayer capacitor including a capacitor body and a pair of external electrodes, respectively disposed on external surfaces of the capacitor body in a first direction; and an interposer disposed below the multilayer capacitor and including an interposer body, a pair of via holes penetrating through the interposer body, and a pair of via electrodes, respectively disposed in the via holes to be connected to the pair of external electrodes, respectively. 0.24T≤t≤0.3T, where "T" is a maximum height of the multilayer capacitor and "t" is a maximum height of the interposer.

20 Claims, 7 Drawing Sheets

ELECTRONIC COMPONENT AND BOARD FOR MOUNTING THE SAME

CROSS-REFERENCE TO RELATED APPLICATION(S)

The present application claims the benefit of priority to Korean Patent Application No. 10-2020-0159048, filed on Nov. 24, 2020 in the Korean Intellectual Property Office, the entire disclosure of which is incorporated herein by reference.

TECHNICAL FIELD

The present disclosure relates to an electronic component and a board for mounting the same.

BACKGROUND

Multilayer capacitors are used in various electronic devices due to a small size and high capacitance thereof. Such a multilayer ceramic capacitor may have a structure in which a plurality of dielectric layers and internal electrodes, having opposing polarities and interposed between respective dielectric layers, are alternately laminated.

In this case, the dielectric layers have piezoelectric properties. Therefore, when a direct current (DC) voltage or an alternating current (AC) voltage is applied to the multilayer ceramic capacitor, a piezoelectric phenomenon may occur between the internal electrodes to generate periodic vibrations while expanding and contracting the volume of a capacitor body.

Such vibrations may be transferred to a board through a solder, connecting the external electrode and the board to each other, and thus an entire board may act as an acoustic reflective surface to generate vibration sound as noise. The vibration sound may correspond to an audio frequency in a range of 20 to 20,000 Hz, which may cause human discomfort. Such vibration sound, causing listener discomfort, is known as acoustic noise.

As a technology for reducing such acoustic noise, various technologies, such as a method of attaching an interposer to a lower side of a capacitor, a method of not providing an internal electrode in a lower region of a capacitor body, or the like, have been developed and used.

However, even when such a method is used, an acoustic noise reduction effect may vary depending on a height of a solder applied when a multilayer capacitor is mounted on a board. For example, when the solder is formed to have a height greater than a specific height, the acoustic noise reduction effect of the multilayer capacitor is significantly reduced.

Accordingly, there is a need for a technology to prevent an acoustic noise reduction effect of a multilayer capacitor from decreasing depending on the amount of a solder applied when mounted on a board, while more effectively reducing acoustic noise of a multilayer capacitor.

SUMMARY

An aspect of the present disclosure is to provide an electronic component, capable of reducing acoustic noise caused by vibrations generated when mounted on a board.

According to an aspect of the present disclosure, an electronic component includes: a multilayer capacitor including a capacitor body and a pair of external electrodes, respectively disposed on external surfaces of the capacitor body in a first direction; and an interposer disposed below the multilayer capacitor and including an interposer body, a pair of via holes penetrating through the interposer body, and a pair of via electrodes, respectively disposed in the via holes to be connected to the pair of external electrodes. $0.24T \leq t \leq 0.3T$, where "T" is a maximum height of the multilayer capacitor and "t" is a maximum height of the interposer.

According to an aspect of the present disclosure, an electronic component includes: a multilayer capacitor including a capacitor body and a pair of external electrodes, respectively disposed on external surfaces of the capacitor body in a first direction; and an interposer disposed below the multilayer capacitor and including an interposer body, a pair of via holes penetrating through the interposer body, and a pair of via electrodes, respectively disposed in the via holes to be connected to the pair of external electrodes. $0.2a < P < 0.29a$ and $0.6b < Q < 0.89b$, where "a" and "b" are a length of the interposer in the first direction and a length of the interposer in a second direction, perpendicular to the first direction, at the same height, respectively, and "P" and "Q" are lengths of the via hole in the first and second directions, respectively.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

The terms used in the description of the present disclosure are used to describe a specific embodiment, and are not intended to limit the present disclosure. A singular term includes a plural form unless otherwise indicated. The terms "include," "comprise," "is configured to," etc. of the description of the present disclosure are used to indicate the presence of features, numbers, steps, operations, elements, parts, or combination thereof, and do not exclude the possibilities of combination or addition of one or more additional features, numbers, steps, operations, elements, parts, or combination thereof. Also, the terms "disposed on," "positioned on," and the like, may indicate that an element is positioned on or beneath an object, and does not necessarily mean that the element is positioned above the object with reference to a direction of gravity.

Terms such as "coupled to," "combined to," and the like, may not only indicate that elements are directly and physically in contact with each other, but also include the configuration in which another element is interposed between the elements such that the elements are also in contact with the other component.

Sizes and thicknesses of elements illustrated in the drawings are indicated as examples for ease of description, and the present disclosure are not limited thereto.

When orientations are defined to clearly describe an embodiment in the present disclosure, X, Y, and Z on the drawings indicate a length direction, a width direction, and a thickness direction of a multilayer capacitor, an electronic component, and a board for mounting the same, respectively.

In the present specification, a length direction refers to an X direction or a first direction, a width direction refers to a Y direction or a second direction, a thickness direction refers to a Z direction, a third direction, or a laminating direction.

Electronic Component

Figure 1:
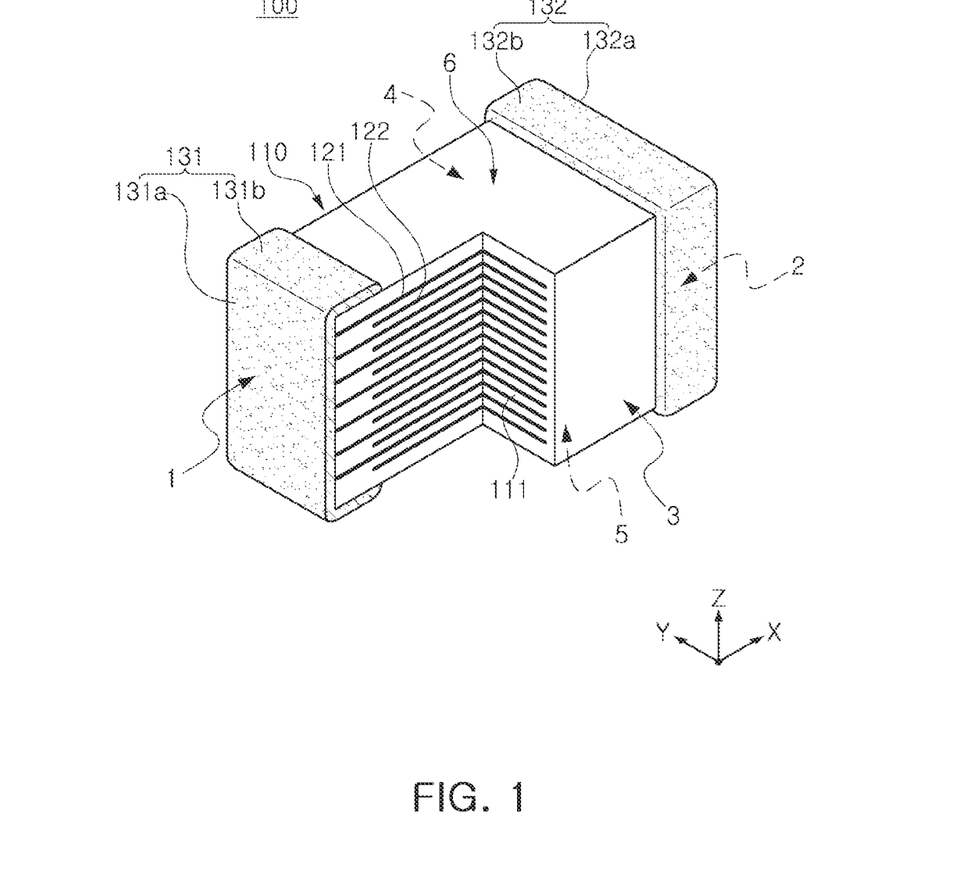
FIG. 1 is a partially cut-away perspective view of a multilayer capacitor applied to an electronic component according to the present disclosure.
Figure 2A:
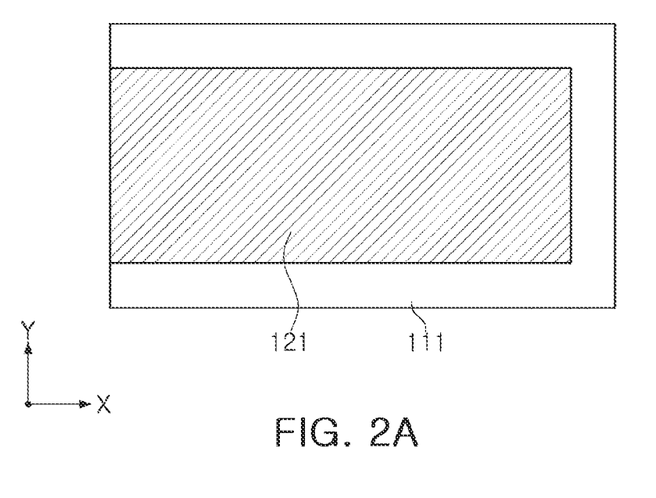
FIGS. 2A and 2B are plan views of a first internal electrode and a second internal electrode included in the multilayer capacitor of FIG. 1, respectively.
Figure 2B:
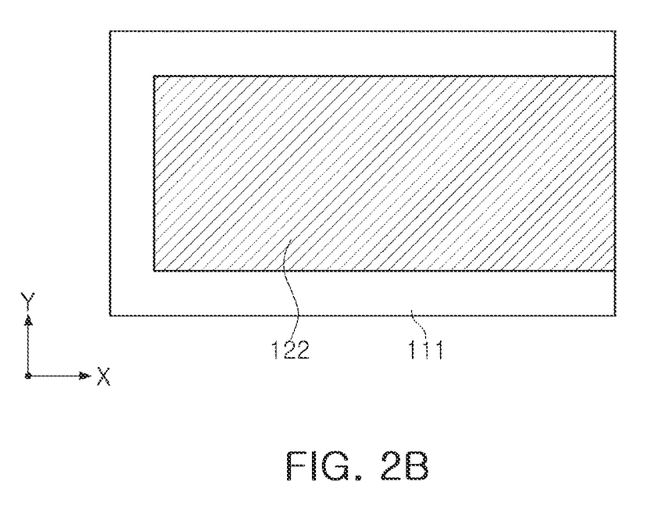

FIG. 1 is a partially cut-away perspective view of a multilayer capacitor applied to an electronic component according to the present disclosure, and FIGS. 2A and 2B are plan views of a first internal electrode and a second internal electrode included in the multilayer capacitor of FIG. 1, respectively.

Hereinafter, a structure of a multilayer capacitor, applied to an electronic component of the present embodiment, will be described with reference to FIGS. 1, 2A, and 2B.

A multilayer capacitor 100 according to the present embodiment may include a capacitor body 110 and a pair of external electrodes 131 and 132, respectively disposed on external surfaces of the capacitor body 110 in a first direction (an X direction).

The capacitor body 110 may be formed by laminating a plurality of dielectric layers 111 in a third direction (a Z direction) and then sintering the laminated dielectric layers 111. Adjacent dielectric layers 111 of the capacitor body 110 are integrated such that boundaries therebetween may not be readily apparent without using a scanning electron microscope (SEM).

The capacitor body 110 may include a plurality of dielectric layers 111 and first and second internal electrodes 121 and 122 alternately disposed in a third direction (a Z direction) with respective dielectric layers 111 interposed therebetween.

The capacitor body 110 may include an active portion, contributing to formation of capacitance of a multilayer capacitor, and cover portions 112 and 113 (shown in FIG. 5), respectively provided on both side portions of the capacitor body 110 in a second direction (a Y direction) and upper and lower portions of the active region in the third direction (the Z direction) as margin portions.

A shape of the capacitor body 110 is not limited, but may be a hexahedral shape. The capacitor body 110 may have a first surface 1 and a second surface 2, opposing each other in the first direction, a third surface 3 and a fourth surface 4, connected to the first and second surfaces 1 and 2 and opposing each other in the second direction, and a fifth surface 5 and a sixth surface 6, connected to the first, second, third, and fourth surfaces 1, 2, 3, and 4 and opposing each other in the third direction.

A raw material for forming the dielectric layer 111 is not limited, as long as sufficient electrostatic capacitance may be obtained therewith. For example, a barium titanate based material, a lead composite perovskite based material, or a strontium titanate based material may be used as the raw material of the dielectric layer 111.

As a material for forming the dielectric layer 111, various ceramic additives, organic solvents, plasticizers, binders, dispersants, or the like, may be added to barium titanate ($BaTiO_3$) powder particles, or the like, depending on the purpose of the present disclosure.

The plurality of internal electrodes 121 and 122 may include a first internal electrode 121 and a second internal electrode 122. The first and second internal electrodes 121 and 122 may be applied with opposite polarities, and may be formed on the dielectric layer 111 to be laminated in the third direction (the Z direction). The first and second internal electrodes 121 and 122 may be alternately disposed inside the capacitor body 110 to oppose each other in the Z direction with a single dielectric layer 111 interposed therebetween.

In this case, the first and second internal electrodes 121 and 122 may be electrically insulated from each other by the dielectric layer 111 disposed therebetween.

One end of the first internal electrode 121 and one end of the second internal electrode 122 may be exposed through the first surface 1 and the second surface 2 of the capacitor body 110, respectively. Such end portions of the first and second internal electrodes 121 and 122, alternately exposed through the first surface 1 and the second surface 2 of the capacitor body 110, may be connected to the first and second external electrodes 131 and 132, disposed on both end portions of the capacitor body 110 in the first direction to be described later, to be electrically connected thereto, respectively.

According to the above-described configuration, when a predetermined voltage is applied to the first and second external electrodes 131 and 132, charges are accumulated between the first and second internal electrodes 121 and 122. In this case, the capacitance of the multilayer capacitor 100 may be in proportion to an area of overlap between the first and second internal electrodes 121 and 122, overlapping each other in the Z direction in the active region.

A material, forming the first and second internal electrodes 121 and 122, is not limited. For example, the first and second internal electrodes 121 and 122 may be formed using a precious metal material or a conductive paste formed of at least one of nickel (Ni) and copper (Cu). The precious metal material may be platinum (Pt), palladium (Pd), a palladium-silver (Pd—Ag) alloy, or the like.

In this case, a method of printing the conductive paste may be such as screen printing or gravure printing may be used, but the present disclosure is not limited thereto.

The pair of external electrodes 131 and 132 may include head portions 131a and 132a and band portions 131b and 132b, respectively. The head portions 131a and 132a may be respectively disposed on both ends of the capacitor body 110 in the first direction, and may be respectively disposed on both end surfaces of the capacitor body 110 in the first direction. The band portions 131b and 132b may extend from the head portions 131a and 132a to a portion of a lower surface of the capacitor body 110.

More specifically, the pair of external electrodes 131 and 132 may include a first external electrode 131 and a second external electrode 132. The first and second external electrodes 131 and 132 may be provided with voltages having opposite polarities, and may be connected to exposed end portions of the first and second internal electrodes 121 and 122 to be electrically connected thereto, respectively.

The first external electrode 131 may include a first head portion 131a and a first band portion 131b. The first band portion 131a may be disposed on the first surface 1 of the capacitor body 110, and may be in contact with an end portion exposed outwardly of the first external electrode 121 through the first surface 1 of the capacitor body 110, serving to electrically connect the first internal electrode 121 and the first external electrode 131 to each other. The first band portion 131b may extend from the first head portion 131a to a portion of the third, fourth, five, and sixth surfaces 3, 4, 5, and 6 of the capacitor body 110 to improve adhesion strength, or the like.

The second external electrode 132 may include a second head portion 132a and a second band portion 132b. The second head portion 132a may be disposed on the second surface 2 of the capacitor body 110, and may be in contact with an end portion exposed outwardly of the second internal electrode 122 through the second surface 2 of the capacitor body 110, serving to electrically connect the second internal electrode 122 and the second external electrode 132 to each other. The second band portion 132b may extend from the second head portion 132a to a portion of the third, fourth, fifth, and sixth surfaces 3, 4, 5, and 6 of the capacitor body 110 to improve adhesion strength, or the like.

Any material, such as a metal or the like, may be used as a material of the external electrodes 131 and 132 as long as it has electrical conductivity. A detailed material of the external electrodes 131 and 132 may be determined in consideration of electrical characteristics, structural stability, and the like. As necessary, the external electrodes 131 and 132 may have a multilayer structure.

Each of the external electrodes 131 and 132 may be a sintered electrode including a conductive metal and a glass, or a resin-based electrode including a conductive metal and a resin. As the conductive material included in each of the first and second electrodes 131 and 132, a material having improved electrical conductivity may be used, but the conductive material is not limited thereto. For example, the conductive metal may be one or more of nickel (Ni), copper (Cu), and alloys thereof.

The first and second external electrodes 131 and 132 may further include a plating layer. The plating layer may include first and second nickel (Ni) plating layers and first and second tin (Sn) plating layers, respectively covering the first and second nickel (Ni) plating layers.

Figure 3:
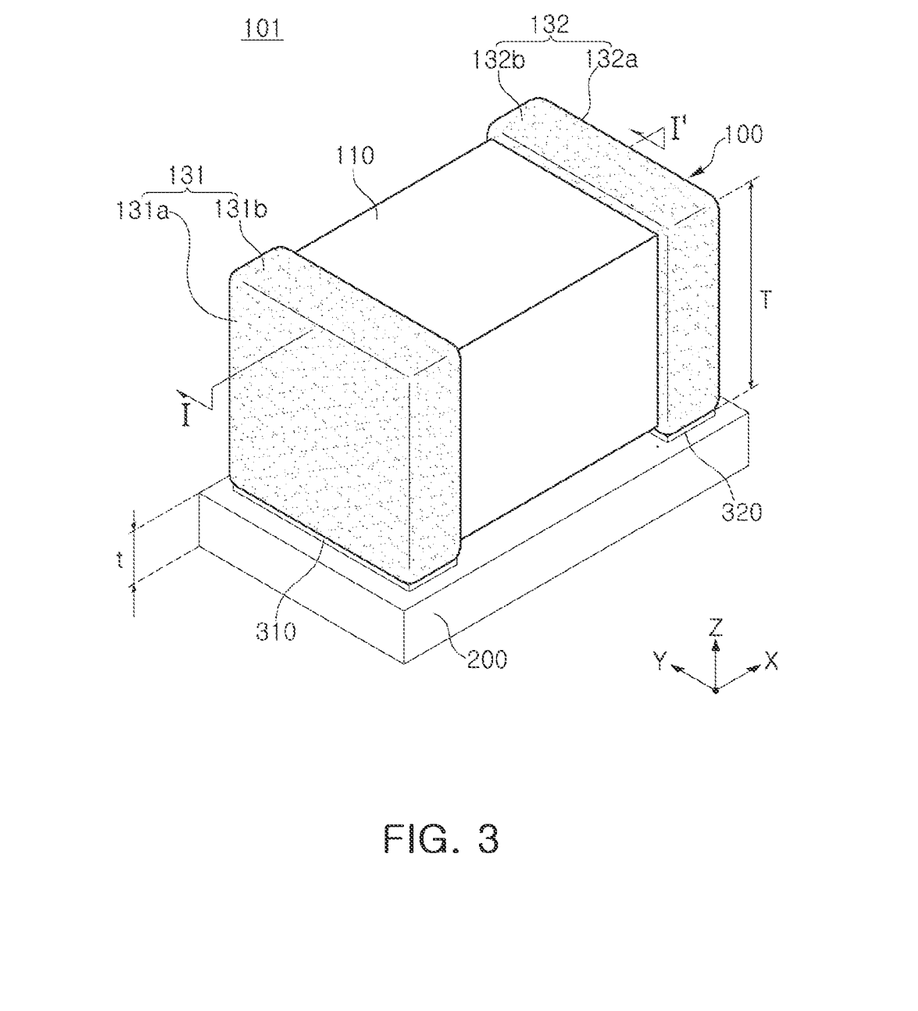
FIG. 3 is a perspective view of an electronic component according to an exemplary embodiment of the present disclosure.
Figure 4:
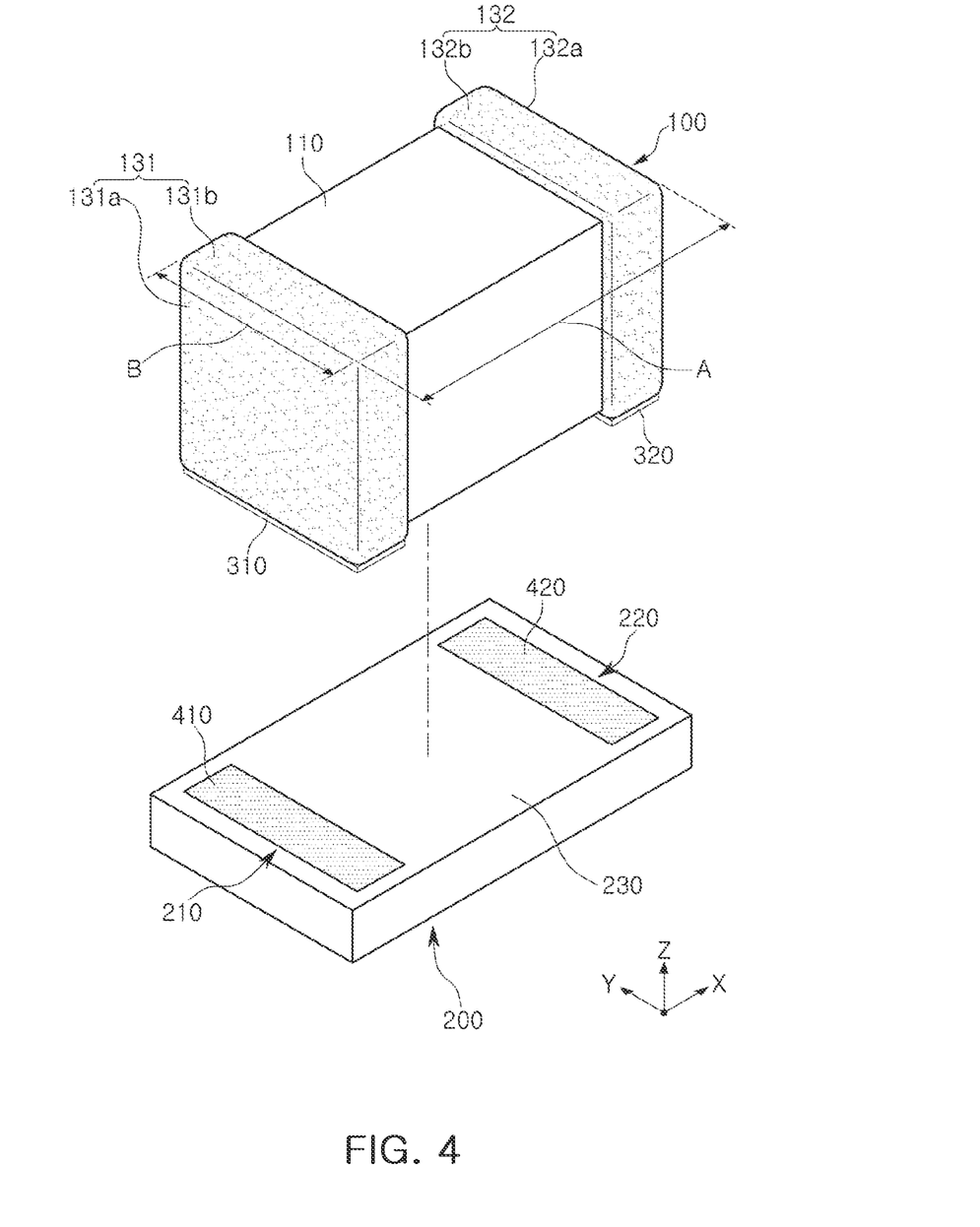
FIG. 4 is an exploded perspective view of FIG. 3.
Figure 5:
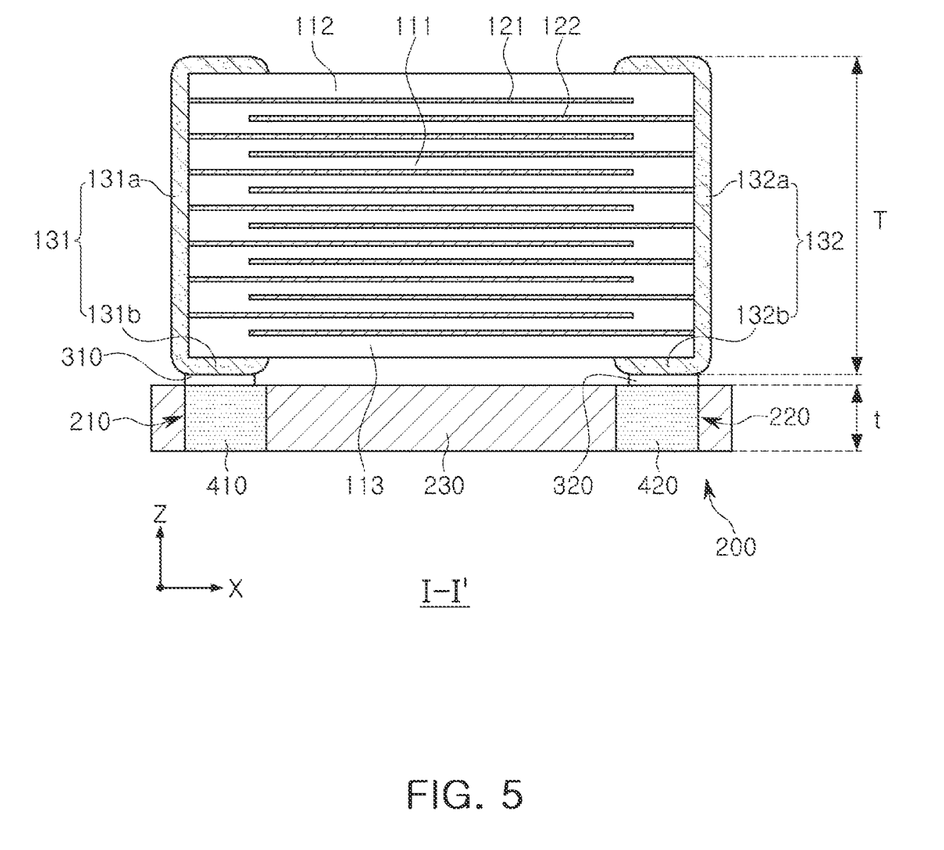
FIG. 5 is a cross-sectional view taken along line I-I' of FIG. 3.
Figure 6:
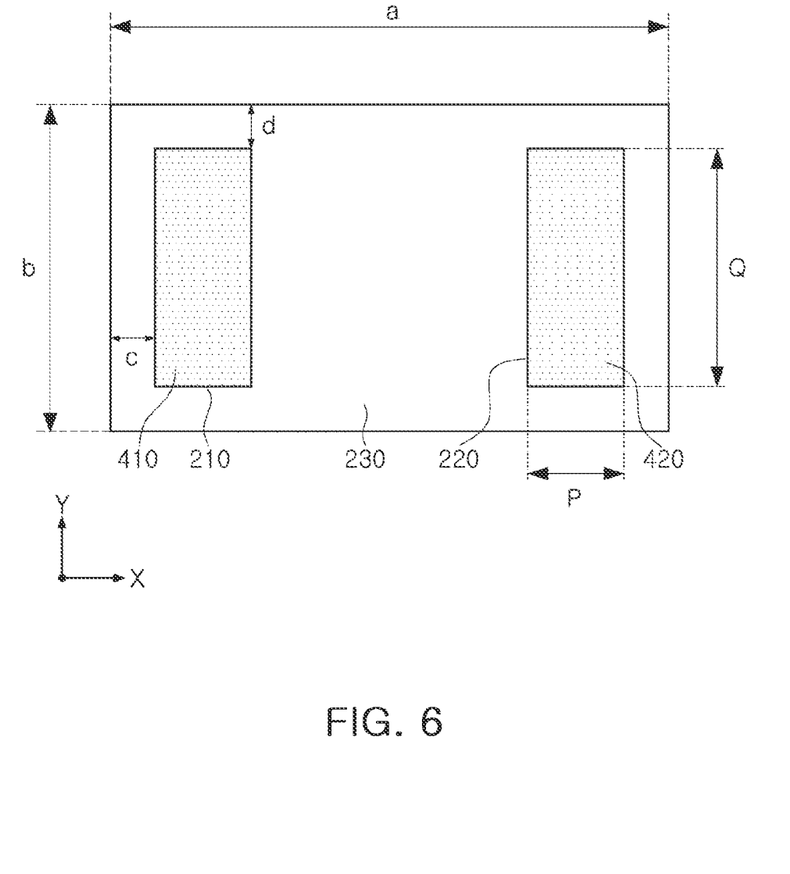
FIG. 6 is a schematic plan view of an interposer included in the electronic component of FIG. 3.

FIG. 3 is a perspective view of an electronic component according to an exemplary embodiment of the present disclosure, FIG. 4 is an exploded perspective view of FIG. 3, and FIG. 5 is a cross-sectional view taken along line I-I' of FIG. 3. FIG. 6 is a schematic plan view of an interposer included in the electronic component of FIG. 3.

Referring to FIGS. 3 to 5, an electronic component 101 according to an exemplary embodiment may include a multilayer capacitor 100 and an interposer 200 disposed below the multilayer capacitor 100.

The interposer 200 may include an interposer body 230, a pair of via holes 210 and 220 penetrating through the interposer body 230, and a pair of via electrodes 410 and 420, respectively disposed in the via holes 210 and 220 to be connected to the pair of external electrodes 131 and 132.

A shape of the interposer body 230 is not limited, but may be a cuboidal shape. Therefore, the interposer 200 may also have a cuboidal shape overall.

The interposer body 230 may be formed of various insulating material. For example, the interposer body 230 may be formed of a polymer resin, generally used to manufacture a board, or the like. Since such a polymer resin has elasticity in terms of material properties, the polymer resin may serve to absorb a portion of vibration, generated when mounted on a printed circuit board (PCB), to prevent the vibration from being be transmitted to the multilayer capacitor 100.

Referring to FIGS. 4 to 6, a pair of via holes 210 and 220 may be formed to penetrate through the interposer body 230. The pair of via holes 210 and 220 may include a first via hole 210, connected to the first external electrode 131, and a second via hole 220 connected to the second external electrode 132. Accordingly, the first and second via holes 210 and 220 may be formed to be symmetrical to each other in a first direction.

In this case, a shape of each of the first and second via holes 210 and 220 is not limited, but may be a cuboidal shape. For example, each of the first and second via holes 210 and 220 may have a shape of cuboid, of which a length in a first direction is smaller than a length in a second direction, to correspond to the shape of each of the first and second band portions 131b and 132b.

A pair of via electrodes 410 and 420 may be disposed in the via holes 210 and 220. The first via electrode 410 may fill the first via hole 210, and the second electrode 420 may fill the second via hole 220.

Various methods may be used to form the via electrodes 410 and 420. For example, the via electrodes 410 and 420 may be formed by filling internal spaces of the first and second via holes 210 and 220 with a conductive material having fluidity and hardening the conductive material. In this case, the conductive material forming the via electrodes 410 and 420 is not limited, and may be a material including a conductive metal, for example, nickel (Ni), copper (Cu), palladium (Pd), gold (Au), or alloys thereof.

Since the via electrodes 410 and 420 are formed in a manner of filling the via holes 210 and 220, the via electrodes 410 and 420 may be formed to completely fill the internal spaces of the via holes 210 and 220. For example, the volume of the internal spaces of the via holes 210 and 220 and the volume of the via electrodes 410 and 420 may be the same.

When the via electrodes 410 and 420 are formed to completely fill the interior of the via holes 210 and 220, the upper and lower surfaces of the via electrodes 410 and 420 form the same plane as the upper and lower surfaces of the interposer body 230, respectively. For example, the via electrodes 410 and 420 may be filled to the same height as the upper and lower surfaces of the interposer body 230, and thus, may not protrude outwardly of the interposer body 230. When the multilayer capacitor 100 is disposed on the interposer 200, an overall height of the electronic component 101 may be adjusted to a minimum value.

However, the via electrodes 410 and 420 do not necessarily have to be formed in such a manner, and may be formed such that remaining spaces are reserved in the via holes 210 and 220. In this case, the remaining spaces may be filled with a solder applied when the electronic component 101 is mounted on the printed circuit board.

Since the first and second via electrodes 410 and 420 are formed such that the upper and lower surfaces of the first and second via electrodes 410 and 420 are respectively exposed to the upper and lower surfaces of the interposer body 230, the first and second via electrodes 410 and 420 may be electrically connected to a component in contact with the interposer 200.

The upper surfaces of the first and second via electrodes 410 and 420 may be in contact with and connected to the first and second external electrodes 131 and 132 of the multilayer capacitor 100 disposed on the interposer 200. In this case, the multilayer capacitor 100 and the interposer 200 may be coupled to each other through conductive bonding layers 310 and 320. In this case, the upper surfaces of the first and second via electrodes 410 and 420 may be connected to the first and second external electrodes 131 and 132 via the conductive bonding layers 310 and 320 disposed on the interposer 200.

The lower surfaces of the first and second via electrodes 410 and 420 may be in contact with and connected an electrode pad of a printed circuit board to be described later. In this case, the electronic component 101 and the printed circuit board may be coupled to each other through a solder. In this case, the lower surfaces of the first and second via electrodes 410 and 420 may be connected to the electrode pad of the printed circuit board via a solder disposed below the interposer 200.

Referring to FIGS. 3 to 5, the electronic component 101 according to an exemplary embodiment may further include conductive bonding layers 310 and 320 disposed between the multilayer capacitor 100 and the interposer 200. For example, a pair of conductive bonding layers 310 and 320 may be formed between the lower surface of the multilayer capacitor 100 and the upper surface of the interposer 200.

Specifically, the pair of conductive bonding layers 310 and 320 may be disposed in various regions. For example, the pair of conductive bonding layers 310 and 320 may be disposed between band portions 131b and 132b, corresponding to the lower surfaces of the external electrodes 131 and 132, and the upper surfaces of the via electrodes 410 and 420, respectively. In this case, some of the conductive bonding layers 310 and 320 may be formed while filling some remaining spaces of the via holes 210 and 220.

The conductive bonding layers 310 and 320 may include a conductive metal and a resin, serving to electrically connect the external electrodes 131 and 132 and the via electrodes 410 and 420 to each other and, simultaneously, serving to improve bonding force between the multilayer capacitor 100 and the interposer 200 to increase adhesion strength. However, the material is not limited thereto, and any material may be employed as long as it has conductivity and bondability.

When voltages having opposite polarities are applied to the first and second external electrodes 131 and 132 formed on the electronic component 101 while the electronic component 101 is mounted on the printed circuit board, the capacitor body 110 may be expanded and contracted in a Z direction by an reverse piezoelectric effect of the dielectric layer 111.

In this case, both end portions of the first and second external electrodes 131 and 132 may be contracted and expanded due to a Poisson effect, in contrast to the expansion and contraction of the capacitor body 110 in the Z direction, and thus, vibration may occur. The vibration is transmitted to the printed circuit board through the first and second external electrodes 131 and 132, so that sound may be radiated from the printed circuit board to generate acoustic noise.

The interposer 200 according to the present embodiment may be attached to a fifth surface 5, a direction in which the multilayer capacitor 100 is mounted, to serve to prevent the vibration of the multilayer capacitor 100 from being transmitted to the printed circuit board. Thus, acoustic noise generated in the multilayer capacitor 100 may be reduced.

In the case of an electronic component using an interposer according to the related art, acoustic noise has been reduced. However, since a current path was increased by a thickness of the interposer when an AC voltage was applied, a side effect such an increase in equivalent series inductance (ESL) has occurred.

In the electronic component 101 according to the present embodiment, the interposer 200 may be disposed below the multilayer capacitor 100 to reduce acoustic noise, and the via holes 210 and 220 may be formed in the interposer 200 and the via electrodes 410 and 420 may be disposed in the via holes 210 and 220. Accordingly, a current path may be formed through the via electrodes 410 and 420 disposed to be in direct contact with a mounting surface of the printed circuit board. Thus, unlike the electronic component according to the related art, acoustic noise may be reduced without an increase in ESL.

Lengths "a" and "b" of the interposer 200 according to the present embodiment in the first and second directions may have various values, but may be greater than maximum lengths "A" and "B" of the multilayer capacitor 100 in the first and second directions, respectively.

The maximum length "A" of the multilayer capacitor 100 in the first direction refers to a maximum distance, among vertical distances of the multilayer capacitor 100 including the first and second external electrodes 131 and 132 in the first direction (the X direction).

Similarly, the maximum length "B" of the multilayer capacitor 100 in the second direction may refer to a maximum distance, among vertical distances of the multilayer capacitor 100 including the first and second external electrodes 131 and 132 in the second direction (the Y direction).

In addition, the length "a" of the interposer 200 in the first direction refers to a maximum distance, among vertical distances of the interposer 200 in the first direction (the X direction). In the case of the interposer 200 having a cuboidal shape, the length "a" corresponds to a straight-line distance between both end surfaces of the interposer body 230.

The length "b" of the interposer 200 in the second direction refers to a maximum distance, among vertical distances of the interposer 200 in the second direction (the Y direction). In the case of the interposer 200 having a cuboidal shape, the length "b" corresponds to a straight-line distance between both end surfaces of the interposer body 230 in the Y direction.

In one example, a maximum height, a maximum distance, a maximum length, or the like may be a maximum value among values through a predetermined number, such as five or 10, of measurements for a respectively parameter at different locations. The present disclosure is not limited thereto.

As described above, the interposer 200 may be formed to have a greater length than the multilayer capacitor 100 in the length and width directions, so that a solder may be blocked so as not to be connected to a height, at which the multilayer capacitor 100 is disposed, when the electronic component 101 is mounted on the printed circuit board.

Accordingly, the amount of vibration, generated in the multilayer capacitor 100 by the solder and then transmitted to the printed circuit board, may be reduced, and an acoustic noise reduction effect may be more significantly improved.

Each of the lengths "a" and "b" of the interposer 200 in the first and second directions may be limited within a predetermined range, and thus, acoustic noise may be effectively reduced while significantly increasing an area occupied by the electronic component 101.

In addition, a length (for example, a height "t") of the interposer 200 in the third direction may have various values, but may be limited within a predetermined range. For example, the interposer 200 may be formed such that a maximum height "t" of the interposer 200 is adjusted depending on a maximum height "T" of the multilayer capacitor 100. Accordingly, acoustic noise may be effectively reduced without a significant increase in the overall height of the electronic component 101.

The maximum height "T" of the multilayer capacitor 100 refers to an average value of a maximum distance, among vertical distances of the multilayer capacitor 100 including the first and second external electrodes 131 and 132 in the Z direction.

The maximum height "t" of the interposer 200 refers to a maximum distance, among the vertical distances of the interposer 200 in the Z direction. In the case of the interposer 200 having a cuboidal shape, the maximum height "t" corresponds to a straight-line distance between both end surfaces of the interposer body 230 in the Z direction.

In addition, sizes of the via holes 210 and 220 may have various values, but may be limited within a predetermined range. More specifically, lengths P and Q of the via holes 210 and 220 in the first and second directions may be limited within a predetermined range. Accordingly, the via electrodes 410 and 420 may also be formed to have sizes limited within a predetermined range to correspond to the sizes of the via holes 210 and 220.

The length "P" of the via holes 210 and 220 in the first direction refers to a maximum distance, among vertical distances of each of the via holes 210 and 220 in the first direction (the X direction). In the case of the via holes 210 and 220 having a cuboidal shape, the length "P" corresponds to a straight-lie distance between both internal side surfaces spaced apart from each other in the X direction.

The length "Q" of the via holes 210 and 220 in the second direction refers to a maximum distance, among vertical distances of each of the via holes 210 and 220 in the second direction (the Y direction). In the case of the via hole 210 and 220 having a cuboidal shape, the length "Q" corresponds to a straight-line distance between internal side surfaces separated from each other in the Y direction.

As the sizes of the via electrodes 410 and 420 are increased, the magnitude of the vibration, transmitted to the printed circuit board by the via electrodes 410 and 420, may also be increased. Meanwhile, as the sizes of the via electrodes 410 and 420 are decreased, bonding force to the via electrodes 410 and 420, connected to upper surfaces of the via electrodes 410 and 420, may be reduced to reduce adhesion strength of the multilayer capacitor 100.

Accordingly, the lengths "P" and "Q" of the via holes 210 and 220 in the first and second directions are limited within a predetermined range, so that when the multilayer capacitor 100 is mounted on the printed circuit board, the vibration transmitted to the printed circuit board may not be significantly increased while maintaining the adhesion state.

The via holes 210 and 220 may be formed in various locations, but may be disposed to be spaced apart from both ends of the interposer body 230 in the first direction and both ends of the interposer body 230 in the second direction. For example, the first and second via holes 210 and 220 may not be formed to be in close contact with each corner of the interposer body 230, but may be spaced apart from an internal region of the interpose body 230 by predetermined distances "c" and "d", respectively.

For example, the first and second via holes 210 and 220 may be respectively spaced apart from both ends of the interposer body 230 in the first direction by a distance of 50 µm or more, and may be respectively spaced apart from both ends of interposer body 230 the second direction by a distance of 50 µm or more.

As described above, the via holes 210 and 220 may be only formed within the internal region of the interposer body 230, so that the via electrodes 410 and 420 may not be exposed to the side surfaces of the interposer 200 in the first and second directions. Accordingly, when the electronic component 101 is mounted by applying solders to the lower surfaces of the via electrodes 410 and 420, a relatively strong attractive force may act on the via electrodes 410 and 420 including a material similar to a material of the solder, whereas a relatively weak attractive force may act on the interposer 200 including a material different from a material of the interposer 200. Thus, the solders may be inhibited from rising to the side surfaces of the interposer 200 in the first and second directions, and the degree of transmission of the vibration transmitted to the printed circuit board may also be reduced by the solders.

The contents regarding the lengths "a" and "b" and height "t" of the interposer 200 and the lengths "P" "Q" of the via holes 210 and 220 will be described using detailed values in the experimental example to be described later.

Board for Electronic Component

Figure 7:
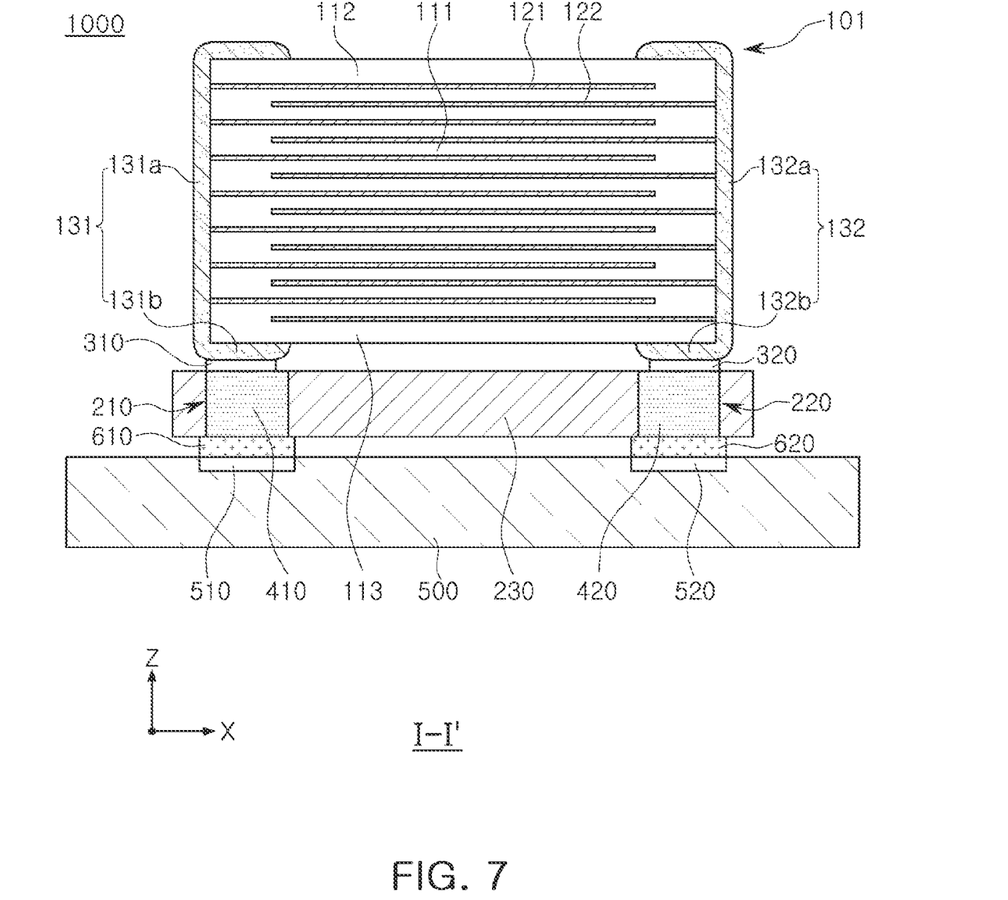
FIG. 7 is a cross-sectional view, taken along line I-I' of FIG. 3, illustrating that the electronic component of FIG. 3 is mounted on a printed circuit board.

FIG. 7 is a cross-sectional view, taken along line I-I' of FIG. 3, illustrating that the electronic component of FIG. 3 is mounted on a printed circuit board.

Referring to FIG. 7, a board 1000 for mounting an electronic component according to the present exemplary embodiment may include a printed circuit board 500 having at least a pair of electrode pads 510 and 520 thereon, an electronic component 101 mounted on the printed circuit board 500, and solders 610 and 620 connecting the electrode pads 510 and 520 and the electronic component 101 to each other.

The pair of electrode pads 510 and 520 may include a first electrode pad 510 and a second electrode pad 520, respectively connected to the first and second via electrodes 410 and 420 of the interposer 200 in the electronic component 101.

In this case, the first and second via electrodes 410 and 420 of the interposer 200 may be electrically connected to the printed circuit board 500 by the solders 610 and 620 while being in disposed to be in contact with the first and second electrode pads 510 and 520, respectively.

The solders 610 and 620 may be disposed to cover various regions. For example, as illustrated in FIG. 7, the solders 610 and 620 may be disposed between the pair of electrode pads 510 and 520 and lower surfaces of a pair of via electrodes 410 and 420, respectively.

More specifically, the solders 610 and 620 may include a first solder 610 disposed in a location of overlapping a first external electrode 131, a first conductive adhesive layer 310, a first via electrode 410, and a first electrode pad 510 in a third direction. In addition, the solders 610 and 620 may include a second solder 620 in a location of overlapping a second external electrode 132, a second conductive adhesive layer 320, a second via electrode 420, and a second electrode pad 520 in the third direction.

The solders 610 and 620 may not be formed on side surfaces of the interposer 200 in the first and second directions. The solders 610 and 620 may be intensively applied to lower surfaces of the via electrodes 410 and 420 in such a manner, so that a relatively strong attractive force may act on the via electrodes 410 and 420 including a material similar to a material of the solders 610 and 620, whereas a relatively weak attractive force may act on the interposer 200 including a material different from the material of the solders 610 and 620.

Accordingly, the solders 610 and 620 may be inhibited from rising to the side surfaces of the interposer 200 in the first and second directions, and the degree of vibration transmitted to the printed circuit board 500 may be reduced by the solders 610 and 620. In addition, since piezoelectric stress is directly transmitted from the multilayer capacitor 100 to the printed circuit board 500 through the first and second external electrodes 131 and 132, an acoustic noise reduction effect may be improved.

Moreover, the electronic component 101 may be mounted on the printed circuit board 500 using a smaller amount of solder 610 and 620, and the solder 610 and 620 may not be formed to a height at which the electronic component 101 is disposed, so that the acoustic noise reduction effect may be prevented from being reduced according to the amount of applied solders.

In addition, the conductive adhesive layers 310 and 320 according to the present embodiment may be formed of a material having a higher melting temperature than the solders 610 and 620.

Accordingly, when a molten solder is applied to the printed circuit board 500, the conductive adhesive layers 310 and 320 may be prevented from being melted, and separation between the multilayer capacitor 100 and the interposer 200, caused by a decrease in bonding force therebetween, may be inhibited.

For example, the solders 610 and 620 may be formed to include tin (Sn), and thus, may have a melting point of about 230° C. In this case, the conductive adhesive layers 310 and 320 may be formed of a material having a higher melting point than Sn, and thus, may have a melting point higher than 230° C.

Hereinafter, the present disclosure will be described in more detail by way of Experimental Examples, but the present disclosure is not limited thereto.

EXPERIMENTAL EXAMPLES

Hereinafter, acoustic noise (A/N) values, listed in Tables 1 to 6, represent noise levels measured using multilayer ceramic capacitors (MLCCs) having 1608 and 1005 sizes in units of dB scale. In this case, a noise level depending on acoustic noise was measured while each of the MLCCs was mounted on an fr-4 material substrate having a size of 100 mm×40 mm.

In Tables 1 to 6, "MLCC length" refers to a maximum length "A" of the multilayer capacitor 100 in the first direction, "MLCC width" refers to a maximum length "B" of the multilayer capacitor 100 in the second direction, and "MLCC height" refers to a maximum height "T" of the multilayer capacitor 100 in the third direction.

Additionally, in Tables 1 to 6, "interpose length" refers to a length "a" of the interposer 200 in the first direction, "interposer width" refers to a length "b" of the interposer 200 in the second direction, and "interposer thickness" refers to a maximum height "T" of the interposer 200 in the third direction.

Additionally, in Tables 1 to 6, "via hole length" refers to a length "P" of each of the via holes 210 and 220 in the first direction, and "via hole width" refers to a length "Q" of each of the via holes 210 and 220 in the second direction.

Tables 1 and 2 illustrate the magnitude of acoustic noise of the electronic component 101 depending on the maximum height "T" of the multilayer capacitor 100 and the maximum height "t" of the interposer 200.

A multilayer capacitor 100, used in Table 1, corresponded to a capacitor having a 1608 size, and thus, experimental examples corresponded to the case in which a maximum height "T" of the multilayer capacitor 100 was 800 μm.

TABLE 1

| Experimental Example | T (μm) | a (μm) | b (μm) | t (μm) | A/N (dB) |
|---|---|---|---|---|---|
| 1* | 800 | 1600 | 800 | 180 | 50 |
| 2* | 800 | 1600 | 800 | 190 | 47 |
| 3* | 800 | 1600 | 800 | 200 | 41 |
| 4 | 800 | 1600 | 800 | 210 | 39 |
| 5 | 800 | 1600 | 800 | 220 | 38 |
| 6 | 800 | 1600 | 800 | 230 | 39 |
| 7 | 800 | 1600 | 800 | 240 | 40 |
| 8* | 800 | 1600 | 800 | 250 | 43 |

T: MLCC Height
a: Interposer Length
b: Interposer Width
t: Interposer Thickness

In one example, measurement of a parameter, such as the MLCC height T, the interposer length a, the interposer width b, and the interposer thickness t, and other parameters such as the via hole length P and the via hole Length Q to be described below, or the like, may be performed based on an optical microscope or a scanning electron microscope (SEM) image of a cross-section of the electronic component or using a micrometer. In a case that a cross-section of the electronic component is needed in the measurement, the cross-section may be cut the multilayer capacitor 100 and/or the interposer 200 in the length-thickness plane at a center portion of the multilayer capacitor 100 and/or the interposer 200 in the width direction, or cut the multilayer capacitor 100 and/or the interposer 200 in the width-thickness plane passing a center portion of a band portion of one of the external electrode in the length direction, or cut the multilayer capacitor 100 and/or the interposer 200 in the length-width plane at a respective center portion of the multilayer capacitor 100 and/or the interposer 200 in the thickness direction. The present disclosure is not limited thereto. Other cutting, other measurement methods, or other measurement tools appreciated by one of ordinary skill in the art, even if not described in the present disclosure, may also be used.

Referring to Table 1, in Experimental Examples 1 to 3 in which a maximum height "t" of an interposer 200 was 200 μm or less under the same condition in which the maximum height "T" of the multilayer capacitor 100 was 800, the magnitude of measured acoustic noise was greater than 40 dB. This is interpreted to result from the fact that the interposer 200 was formed to have a significantly smaller height than the multilayer capacitor 100, and thus, served to insufficiently inhibit vibration of the multilayer capacitor 100 from being transmitted to the printed circuit board 500 by the interposer 200.

Even in Experimental Example 8 in which a maximum height "t" of an interposer 200 was 250 μm or more, the magnitude of measured acoustic noise was greater than 40 dB. This is interpreted to result from the fact the interposer 200 was formed to have a significantly great height, and thus, a distance from the printed circuit board 500 to an uppermost end of the electronic component 101 was significantly increased to cause a large amount of vibration to occur due to a decrease in stability of the multilayer capacitor 100.

Therefore, it will be understood that the maximum height "T" of the interposer 200 satisfies the range of, in detail, 210 μm to 240 μm to expect an acoustic noise reduction effect for the MLCC having a 1608 size.

A multilayer capacitor 100, used in Table 2, corresponded to a capacitor having a 1005 size, and thus, experimental examples corresponded to the case in which a maximum height "T" of the multilayer capacitor 100 was 500 μm.

TABLE 2

| Experimental Example | T (μm) | a (μm) | b (μm) | t (μm) | A/N (dB) |
|---|---|---|---|---|---|
| 1* | 500 | 1000 | 500 | 100 | 41.3 |
| 2* | 500 | 1000 | 500 | 110 | 38.5 |
| 3 | 500 | 1000 | 500 | 120 | 32.5 |
| 4 | 500 | 1000 | 500 | 130 | 31.4 |
| 5 | 500 | 1000 | 500 | 140 | 32.8 |
| 6 | 500 | 1000 | 500 | 150 | 33.1 |
| 7* | 500 | 1000 | 500 | 160 | 37.1 |
| 8* | 500 | 1000 | 500 | 170 | 39.7 |

T: MLCC Height
a: Interposer Length
b: Interposer Width
t: Interposer Thickness

Referring to FIGS. 2A and 2B, in Experimental Examples 1 and 2 in which a maximum height "t" of the interposer 200 was 110 μm or less under the same condition in which the maximum height "T" of the multilayer capacitor 100 was 500 μm, the magnitude of measured acoustic noise was greater than 35 dB. This is interpreted to result from the fact that the interposer 200 was formed to have a significantly smaller height than the multilayer capacitor 100, and thus, served to insufficiently inhibit vibration of the multilayer capacitor 100 from being transmitted to the printed circuit board 500 by the interposer 200.

In Experimental Examples 7 and 8 in which a maximum height "t" of the interposer 200 was 160 μm or more, the magnitude of measured acoustic noise was greater than 35 dB. This is interpreted to result from the fact the interposer 200 was formed to have a significantly great height, and thus, a distance from the printed circuit board 500 to an uppermost end of the electronic component 101 was significantly increased to cause a large amount of vibration to occur due to a decrease in stability of the multilayer capacitor 100.

Therefore, it will be understood that the maximum height "T" of the interposer 200 satisfies the range of, in detail, 120 μm to 150 μm to expect an acoustic noise reduction effect for the MLCC having a 1005 size.

In comprehensive consideration of the results of Tables 1 and 2, it will be understood that when the maximum height "t" of the interposer 200 to the maximum height "T" of the multilayer capacitor 100 satisfies 0.24T≤t≤0.3T, acoustic noise in the electronic component 101, below which the interposer 200 is disposed, may be effectively reduced.

Therefore, the electronic component 101 according to an exemplary embodiment may be characterized in that the maximum height "t" of the interposer 200 satisfies 0.24T≤t≤0.3T.

Tables 3 to 6 illustrate experimental examples in which sizes of via holes 210 and 220 and a size range of an interposer 200 were limited to significantly improve an acoustic noise reduction effect, among experimental examples in which a maximum height "t" of an interposer 200 to a maximum height "T" of a multilayer capacitor 100 satisfied 0.24T≤t≤0.3T.

Tables 3 and 4 illustrate magnitudes of acoustic noise of an electronic component 101 based on relationships between lengths "a" and "b" of an interposer 200 in first and second directions and lengths "P" and "Q" of via holes 210 and 220 in the first and second directions.

A multilayer capacitor 100, used in Table 3, corresponded to a capacitor having a 1608 size and a maximum height "T" of 800 μm, and thus, experimental examples corresponded to the case in which lengths "a" and "b" of the interposer 200 in first and second directions matched 1700 μm and 900 μm, respectively, and a maximum height "t" of an interposer 200 matched 200 μm. That is, in each experimental example, only sizes of via holes 210 and 220 were changed while the same interpose 200 was used.

TABLE 3

| Experimental Example | P (μm) | Q (μm) | P/a | Q/b | A/N (dB) |
|---|---|---|---|---|---|
| 1 | 300 | 800 | 0.18 | 0.89 | 39 |
| 2 | 300 | 700 | 0.18 | 0.78 | 39 |
| 3 | 300 | 600 | 0.18 | 0.67 | 39 |
| 4 | 300 | 500 | 0.18 | 0.56 | 38.5 |
| 5 | 400 | 800 | 0.24 | 0.89 | 38 |
| 6 | 400 | 700 | 0.24 | 0.78 | 37.3 |
| 7 | 400 | 600 | 0.24 | 0.67 | 37 |
| 8 | 400 | 500 | 0.24 | 0.56 | 37.8 |
| 9 | 500 | 800 | 0.29 | 0.89 | 38 |
| 10 | 500 | 700 | 0.29 | 0.78 | 38.2 |
| 11 | 500 | 600 | 0.29 | 0.67 | 39 |

P: Via Hole Length
Q: Via Hole Width
P/a: Via Hole Length/Interposer Length
Q/b: Via Hole Width/Interposer Width Referring to Table 3, in Experimental Examples 6 and 7 in which a length "P" of each of via holes 210 and 220 in a first direction was 400 μm and a length "Q" of each of the via holes 210 and 220 in a second direction ranged from 600 μm to 700 μm under the condition in which a maximum height "t" of an interposer 200 was the same, the magnitude of measured acoustic noise was reduced the most. For example, when a ratio of the length "P" of each of the via holes 210 and 220 in the first direction to a length "a" of the interposer 200 in the first direction (P/a) satisfied a range greater than 0.2 to less than 0.29 and a ratio of the length "Q" of each of the via holes 210 and 220 in the second direction to a length "b" of the interposer 200 in the second direction (Q/b) satisfied a range greater than 0.6 to less than 0.89, an acoustic nose reduction effect was more significantly exhibited.

In Experimental Examples 1 to 4 and 8 in which a length "P" of each of via holes 210 and 220 in a first direction was 300 μm or less and a length "Q" of each of the via holes 210 and 220 in a second direction was 500 μm or less, it is interpreted to result from the fact that bonding force to external electrodes 131 and 132 connected to upper surfaces of via electrodes 410 and 420 was reduced to increase the magnitude of vibration occurring in the multilayer capacitor 100.

Therefore, it will be understood that, to further improve an acoustic noise reduction effect while maintain adhesion strength higher than or equal to a level required for an MLCC, a ratio of a length "P" of each of the via holes 210 and 220 in a first direction to a length "a" of the interposer 200 in the first direction (P/a) satisfies a range of, in detail, greater than 0.18 to less than 0.29 and a ratio of a length direction "Q" of each of the via holes 210 and 220 in a second direction to a direction "b" of the interposer 200 in the second direction (Q/b) satisfies a range of, in detail, greater than 0.56 to less than 0.89.

A multilayer capacitor 100, used in Table 4, corresponded to a capacitor having a 1005 size and a maximum height "T" of 500 μm, and thus, experimental examples corresponded to the case in which lengths "a" and "b" of the interposer 200 in first and second directions matched 1000 μm and 500 μm, respectively, and a maximum height "t" of an interposer 200 matched 120 μm. That is, in each experimental example, only sizes of via holes 210 and 220 were changed while the same interpose 200 was used.

TABLE 4

| Experimental Example | P (μm) | Q (μm) | P/a | Q/b | A/N (dB) |
|---|---|---|---|---|---|
| 1 | 200 | 300 | 0.20 | 0.60 | 29.7 |
| 2 | 200 | 350 | 0.20 | 0.70 | 29.5 |
| 3 | 200 | 400 | 0.20 | 0.80 | 29.6 |
| 4 | 250 | 300 | 0.25 | 0.60 | 28 |
| 5 | 250 | 350 | 0.25 | 0.70 | 27.7 |
| 6 | 250 | 400 | 0.25 | 0.80 | 27.3 |
| 7 | 300 | 300 | 0.30 | 0.60 | 27.8 |
| 8 | 300 | 350 | 0.30 | 0.70 | 28.8 |
| 9 | 300 | 400 | 0.30 | 0.80 | 29.5 |

P: Via Hole Length
Q: Via Hole Width
P/a: Via Hole Length/Interposer Length
Q/b: Via Hole Width/Interposer Width Referring to Table 4, in Experimental Examples 5 and 6 in which a length "P" of each of via holes 210 and 220 in a first direction was 250 μm and a length "Q" of each of the via holes 210 and 220 in a second direction ranged from 350 μm to 400 μm under the condition in which a maximum height "t" of an interposer 200 was the same, the magnitude of measured acoustic noise was reduced the most. For example, when a ratio of the length "P" of each of the via holes 210 and 220 in the first direction to a length "a" of the interposer 200 in the first direction (P/a) satisfied a range of greater than 0.2 to less than 0.29 and a ratio of the length "Q" of each of the via holes 210 and 220 in the second direction to a length "b" of the interposer 200 in the second direction (Q/b) satisfied a range of greater than 0.6 to less than 0.89, an acoustic nose reduction effect was more significantly exhibited.

In Experimental Examples 1 to 4 and 7 in which a length "P" of each of via holes 210 and 220 in a first direction was 200 μm or less or a length "Q" of each of the via holes 210 and 220 in a second direction was 300 μm or less, it is interpreted to result from the fact that bonding force to external electrodes 131 and 132 connected to upper surfaces of via electrodes 410 and 420 was reduced to increase the magnitude of vibration occurring in the multilayer capacitor 100.

In addition, in Experimental Examples 7 to 9 in which a length "P" of each of via holes 210 and 220 in a first direction was 300 μm or more, it is interpreted to result from the fact that the magnitude of vibration transmitted to a printed circuit board 500 was increased by the via electrodes 410 and 420.

Therefore, it will be understood that, to further improve an acoustic noise reduction effect while maintain adhesion strength higher than or equal to a level required for an MLCC, a ratio of a length "P" of each of the via holes 210 and 220 in a first direction to a length "a" of the interposer 200 in the first direction (P/a) satisfies a range of, in detail, greater than 0.18 to less than 0.29 and a ratio of a length direction "Q" of each of the via holes 210 and 220 in a second direction to a direction "b" of the interposer 200 in the second direction (Q/b) satisfies a range of, in detail, greater than 0.56 to less than 0.89.

In comprehensive consideration of the results of Tables 3 and 4, when the ratio of the length "P" of each of the via holes 210 and 220 in the first direction to the length "a" of the interposer 200 in the first direction (P/a) satisfies a range of more than 0.18 to less than 0.29 and the ratio of the length "Q" of each of the via holes 210 and 220 in the second direction to the length "b" of the interposer 200 in the second direction satisfies a range of more than 0.56 to less than 0.89, an acoustic noise reduction effect may be more significantly exhibited.

Therefore, the electronic component 101 according to an exemplary embodiment may be characterized in that the lengths "P" and "Q" of the via holes 210 and 220 in the first and second directions satisfy 0.2a<P<0.29a and 0.6b<Q<0.89b, respectively.

Tables 5 and 6 illustrate magnitudes of acoustic noise of an electronic component 101 based on relationships between lengths "a" and "b" of an interposer 200 in first and second directions and lengths "P" and "Q" of via holes 210 and 220 in the first and second directions.

A multilayer capacitor 100, used in Table 5, corresponded to a capacitor having a 1608 size and a maximum height "T" of 800 μm, and thus, experimental examples corresponded to the case in a maximum length "A" of the multilayer capacitor 100 in a first direction was 1600 μm and a maximum length "B" of the multilayer capacitor 100 in a second direction was 800 μm. In addition, in each experimental example, a maximum height "t" of an interposer 200 matched 200 μm, a length "P" of each of first and second vias 210 and 220 in the first direction matched 400 μm, and a length "Q" of each of the first and second vias 210 and 220 in the second direction matched 600 μm.

TABLE 5

| Experimental Example | a (μm) | b (μm) | A-a (μm) | B-b (μm) | A/N (dB) |
|---|---|---|---|---|---|
| 1 | 1600 | 800 | 0 | 0 | 40 |
| 2 | 1700 | 900 | 100 | 100 | 37 |
| 3 | 1800 | 1000 | 200 | 200 | 36 |
| 4 | 1900 | 1100 | 300 | 300 | 36 | a: Interposer Length
b: Interposer Width
A-a: Length Difference
B-b: Width Difference As can be seen from Table 5, as the lengths "a" and "b" of the interposer 200 in the first and second directions were increased under the condition in which the maximum length "t" of the interposer 200 was the same, the magnitude of measured acoustic noise was decreased. In particular, a highest reduction rate of acoustic noise was exhibited from Experimental Example 1 to Experimental Example 2.

As described above, the interposer 200 may be formed to have a greater length than the multilayer capacitor 100 in length and width directions, and thus, solders 610 and 620 may be blocked so as not to be connected to a height, at which the multilayer capacitor 100 is disposed, when the electronic component 101 is mounted on a printed circuit board 500.

However, in the case in which the lengths "a" and "b" of the interposer 200 in the first and second directions are significantly great, an area occupied by the electronic component 101 is increased when the electronic component 101 is mounted on the printed circuit board 500.

Therefore, it can be seen that when a difference between the lengths of the multilayer capacitor 100 and the interposer 200 in the first direction (A-a) and a difference between the lengths of the multilayer capacitor 100 and the interposer 200 in the second direction (B-b) each satisfy a range of greater than 0 μm to less than 200 μm, an acoustic noise reduction effect may exhibit a highest rate of change and the area occupied by the electronic component 101 may be maintained to be smaller.

A multilayer capacitor 100, used in Table 6, corresponded to a capacitor having a 1005 size and a maximum height "T" of 500 μm, and thus, experimental examples corresponded to the case in a maximum length "A" of the multilayer capacitor 100 in a first direction was 1000 μm and a maximum length "B" of the multilayer capacitor 100 in a second direction was 500 μm. In addition, in each experimental example, a maximum height "t" of an interposer 200 matched 200 μm, a length "P" of each of first and second vias 210 and 220 in the first direction matched 120 μm, and a length "Q" of each of the first and second vias 210 and 220 in the second direction matched 350 μm.

TABLE 6

| Experimental Example | a (μm) | b (μm) | A-a (μm) | B-b (μm) | A/N (dB) |
|---|---|---|---|---|---|
| 1 | 1000 | 500 | 0 | 0 | 30 |
| 2 | 1050 | 550 | 50 | 50 | 28 |
| 3 | 1100 | 600 | 100 | 100 | 27.5 |
| 4 | 1200 | 700 | 200 | 200 | 27 | a: Interposer Length
b: Interposer Width
a-A: Length Difference
b-B: Width Difference As can be seen from Table 5, as the lengths "a" and "b" of the interposer 200 in the first and second directions were increased under the condition in which the maximum length "t" of the interposer 200 was the same, the magnitude of measured acoustic noise was decreased.

However, in the case in which the lengths "a" and "b" of the interposer 200 in the first and second directions are significantly great, an area occupied by the electronic component 101 is increased when the electronic component 101 is mounted on the printed circuit board 500.

Therefore, it can be seen that when a difference between the lengths of the multilayer capacitor 100 and the interposer 200 in the first direction (a-A) and a difference between the lengths of the multilayer capacitor 100 and the interposer 200 in the second direction (b-B) each satisfy a range of greater than 0 μm to less than 200 μm, an acoustic noise reduction effect may be effectively exhibited and the area occupied by the electronic component 101 may be maintained to be smaller.

In comprehensive consideration of the results of Tables 5 and 6, when the length "a" of the interposer 200 in the first direction to the maximum length "A" of the multilayer capacitor 100 in the first direction satisfies A<a<A+200 μm, acoustic noise may be effectively reduced without a significant increase in an area occupied by the electronic component 101 on the printed circuit board 500.

In addition, when the length "b" of the interposer 200 in the second direction to the maximum length "B" of the multilayer capacitor 100 satisfies B<b<B+200 μm, acoustic noise may be effectively reduced without a significant increase in an area occupied by the electronic component 101 on the printed circuit board 500.

Therefore, the electronic component 101 according to an exemplary embodiment may be characterized in that the lengths "a" and "b" of the interposer 200 in the first and second directions satisfy A<a<A+200 μm and B<b<B+200 μm, respectively.

As described above, according to an exemplary embodiment, an interposer including a via electrode may be disposed below an electronic component to reduce acoustic nose occurring when the electronic component is mounted on a board.

According to an exemplary embodiment, acoustic noise may be effectively reduced without a significant increase in height of an electronic component.

According to an exemplary embodiment, when an electronic component is mounted on a board, a solder may not be formed to a height at which the electronic component is disposed. Thus, an acoustic noise reduction effect may be prevented from being reduced depending on the amount of an applied solder.

While exemplary embodiments have been shown and described above, it will be apparent to those skilled in the art that modifications and variations could be made without departing from the scope of the present disclosure as defined by the appended claims.

What is claimed is:

1. An electronic component comprising:
   a multilayer capacitor including a capacitor body and a pair of external electrodes, respectively disposed on external surfaces of the capacitor body in a first direction; and
   an interposer disposed below the multilayer capacitor and including an interposer body comprising an insulating material, a pair of via holes penetrating through the interposer body, and a pair of via electrodes, respectively disposed in the via holes to be connected to the pair of external electrodes, respectively,
   wherein $0.24T \leq t \leq 0.3T$, where "T" is a maximum height of the multilayer capacitor and "t" is a maximum height of the interposer between an upper surface and a lower surface of the interposer body in a stacking direction of the multilayer capacitor and the interposer.

2. The electronic component of claim 1, wherein an upper surface and a lower surface of each via electrode are disposed to be coplanar with the upper surface and the lower surface of the interposer body, respectively.

3. The electronic component of claim 1, wherein each of the interposer and the pair of via holes has a cuboidal shape.

4. The electronic component of claim 1, wherein the capacitor body has a first surface and a second surface, opposing each other in the first direction, a third surface and a fourth surface connected to the first and second surfaces and opposing each other in a second direction, perpendicular to the first direction, and a fifth surface and a sixth surface connected to the first, second, third, and fourth surfaces and opposing each other in a third direction, perpendicular to the first and second directions, and includes a plurality of dielectric layers and a plurality of internal electrodes alternately disposed with respective dielectric layers interposed therebetween.

5. The electronic component of claim 4, wherein 0.2a<P<0.29a and 0.6b<Q<0.89b,
   where "a" and "b" are lengths of the interposer in the first and second directions, respectively, and "P" and "Q" are lengths of the via hole in the first and second directions, respectively.

6. The electronic component of claim 5, wherein A<a<A+200 μm and B<b<B+200 μm,
   where "A" and "B" are maximum lengths of the multilayer capacitor in the first and second directions, respectively.

7. The electronic component of claim 5, wherein each via hole is disposed to be spaced apart from both ends of the interposer body in the first direction by a distance of 50 μm or more, and from both ends of the interposer body in the second direction by a distance of 50 μm or more.

8. The electronic component of claim 1, further comprising:
a conductive adhesive layer disposed between the multilayer capacitor and the interposer.

9. The electronic component of claim 8, wherein each of the pair of external electrodes comprises:
head portions, respectively disposed on both end surfaces of the capacitor body in the first direction; and
band portions, respectively extending from the head portions to portions of a lower surface of the capacitor body, and
wherein the conductive adhesive layer includes a pair of conductive adhesive layers, respectively disposed between the band portions of the pair of external electrodes and upper surfaces of the pair of via electrodes.

10. The electronic component of claim 8, wherein the conductive adhesive layer included a material different from the pair of via electrodes.

11. The electronic component of claim 1, wherein 210 μm≤t≤240 μm, or 120 μm≤t≤150 μm.

12. An electronic component comprising:
a multilayer capacitor including a capacitor body and a pair of external electrodes, respectively disposed on external surfaces of the capacitor body in a first direction; and
an interposer disposed below the multilayer capacitor and including an interposer body, a pair of via holes penetrating through the interposer body, and a pair of via electrodes, respectively disposed in the via holes to be connected to the pair of external electrodes, respectively,
wherein 0.2a<P<0.29a and 0.6b<Q<0.89b,
where "a" and "b" are a length of the interposer in the first direction and a length of the interposer in a second direction, perpendicular to the first direction, at the same height, respectively, and "P" and "Q" are lengths of the via hole in the first and second directions, respectively.

13. The electronic component of claim 12, wherein an upper surface and a lower surface of each via electrode are disposed to be coplanar with an upper surface and a lower surface of the interposer body, respectively.

14. The electronic component of claim 12, wherein each of the interposer and the pair of via holes has a cuboidal shape.

15. The electronic component of claim 12, wherein A<a<A+200 μm and B<b<B+200 μm,
where "A" and "B" are maximum lengths of the multilayer capacitor in the first and second directions, respectively.

16. The electronic component of claim 15, wherein each via hole is disposed to be spaced apart from both ends of the interposer body in the first direction by a distance of 50 μm or more, and from both ends of the interposer body in the second direction by a distance of 50 μm or more.

17. The electronic component of claim 16, further comprising:
a conductive adhesive layer disposed between the multilayer capacitor and the interposer.

18. The electronic component of claim 17, wherein each of the pair of external electrodes comprises:
head portions, respectively disposed on both end surfaces of the capacitor body in the first direction; and
band portions, respectively extending from the head portions to portions of a lower surface of the capacitor body, and
wherein the conductive adhesive layer includes a pair of conductive adhesive layers, respectively disposed between the band portions of the pair of external electrodes and upper surfaces of the pair of via electrodes.

19. The electronic component of claim 17, wherein the conductive adhesive layer included a material different from the pair of via electrodes.

20. The electronic component of claim 12, wherein 210 μm≤t≤240 μm, or 120 μm≤t≤150 μm, where "t" is a maximum height of the interposer.

* * * * *